(12) United States Patent
Oshiyama et al.

(10) Patent No.: US 7,759,855 B2
(45) Date of Patent: Jul. 20, 2010

(54) ORGANIC ELECTROLUMINESCENT ELEMENT AND DISPLAY EMPLOYING THE SAME

(75) Inventors: Tomohiro Oshiyama, Hachioji (JP); Hiroshi Kita, Hachioji (JP); Yoshiyuki Suzuri, Musashino (JP)

(73) Assignee: Konica Minolta Holdings, Inc. (JP)

( * ) Notice: Subject to any disclaimer, the term of this patent is extended or adjusted under 35 U.S.C. 154(b) by 1427 days.

(21) Appl. No.: 10/795,850

(22) Filed: Mar. 8, 2004

(65) Prior Publication Data
US 2004/0178721 A1 Sep. 16, 2004

(30) Foreign Application Priority Data
Mar. 12, 2003 (JP) .............................. 2003-066288

(51) Int. Cl.
*H01J 1/62* (2006.01)
*H05B 33/14* (2006.01)
(52) U.S. Cl. ................ 313/504; 313/503; 428/690; 428/917
(58) Field of Classification Search ................ 428/690, 428/917; 257/40; 313/504, 506; 252/301.16, 252/301.35
See application file for complete search history.

(56) References Cited

U.S. PATENT DOCUMENTS

| 6,902,830 B2 * | 6/2005 | Thompson et al. ........... 428/690 |
| 2002/0045061 A1 | 4/2002 | Hosokawa .................. 428/690 |
| 2003/0205696 A1 * | 11/2003 | Thoms et al. .......... 252/301.16 |

FOREIGN PATENT DOCUMENTS

| WO | WO 01/41512 | 6/2001 |
| WO | WO 03/059015 | 7/2003 |

OTHER PUBLICATIONS

Thomas et al. "Improved Host Material Design for Phosphorescent Guest-Host Systems". Thin Solid Films 436 (2003) 264-268; (3 pgs.).
Partial European Search Report EP Patent Application No. 04005057.07-2111- Date: Apr. 19, 2004 Applicant: Konica Minolta Holdings, Inc. (5 pgs.).

* cited by examiner

*Primary Examiner*—D. Lawrence Tarazano
*Assistant Examiner*—Camie S Thompson
(74) *Attorney, Agent, or Firm*—Cantor Colburn LLP

(57) ABSTRACT

Disclosed is an organic electroluminescent element comprising a light emission layer containing a host compound and a phosphorescent compound, the host compound having reorganization energy of from more than 0 to 0.50 eV, wherein the reorganization energy is energy in the process in which the host compound changes to the anion radical, and calculated employing Gaussian 98.

11 Claims, 3 Drawing Sheets

ORGANIC ELECTROLUMINESCENT ELEMENT AND DISPLAY EMPLOYING THE SAME

FIELD OF THE INVENTION

This invention relates to an organic electro-luminescent element and a display employing the organic electroluminescent element.

BACKGROUND OF THE INVENTION

As an emission type electronic displaying device, there is an electroluminescence device (ELD). As elements constituting the ELD, there is an inorganic electroluminescent element or an organic electroluminescent element (hereinafter referred to also as organic EL element). The inorganic electroluminescent element has been used for a plane-shaped light source, but a high voltage alternating current has been required to drive the element.

An organic electroluminescent element has a structure in which a light emission layer containing a light emission compound is arranged between a cathode and an anode, and an electron and a hole were injected into the light emission layer and recombined to form an exciton. The element emits light, utilizing light (fluorescent light or phosphorescent light) generated by inactivation of the exciton, and the element can emit light by applying a relatively low voltage of from several volts to several decade volts. The element has a wide viewing angle and a high visuality since the element is of self light emission type. Further, the element is a thin, complete solid element, and therefore, the element is noted from the viewpoint of space saving and portability.

An organic EL element for practical use is required which efficiently emits light with high luminance at a lower power. For example, in Japanese Patent No. 3093796 is disclosed an element with long lifetime emitting light with high luminance in which stilbene derivatives, distyrylarylene derivatives or tristyrylarylene derivatives are doped with a slight amount of a fluorescent compound, in Japanese Patent O.P.I. Publication Nos. 63-264692 is disclosed an element which comprises an organic light emission layer containing an 8-hydroxyquinoline aluminum complex as a host compound doped with a slight amount of a fluorescent compound, and in Japanese Patent O.P.I. Publication Nos. 3-255190 is disclosed an element which comprises an organic light emission layer containing an 8-hydroxyquinoline aluminum complex as a host compound doped with a quinacridone type dye.

When light emitted through excited singlet state is used in the element disclosed in the above Patent documents, the upper limit of the external quantum efficiency ($\eta$ext) is considered to be at most 5%, as the generation ratio of singlet excited species to triplet excited species is 1:3, that is, the generation probability of excited species capable of emitting light is 25%, and further, external light emission efficiency is 20%.

Since an organic EL element, employing phosphorescence through the excited triplet, was reported by Prinston University (see M. A. Baldo et al., Nature, 395, p. 151-154 (1998)), study on materials emitting phosphorescence at room temperature has been actively made (see M. A. Baldo et al., Nature, 403, 17, p. 750-753 (2000) or U.S. Pat. No. 6,097, 147).

As the upper limit of the internal quantum efficiency of the excited triplet is 100%, the light emission efficiency of the exited triplet is theoretically four times that of the excited singlet. Accordingly, light emission employing the excited triplet exhibits the same performance as a cold cathode tube, and can be applied to illumination.

When a phosphorescent compound is used as a dopant compound, it is necessary that a host compound have the emission maximum-providing wavelength in wavelength regions shorter that that of the phosphorescent compound. However, it has been found that there are other requirements to be satisfied.

There are an example (see for example, Applied Physics Letters, 77, 6, p. 904-906 (2000)) in which a phosphorescent compound emitting a green light is used as a dopant compound and an electron transporting material is used as a host compound; an example (see for example, U.S. Ser. No. 2002/0034656 A) in which a phosphorescent element is manufactured employing as a host compound, a carbazole derivative such as CBP; and an example (see for example, Japanese Patent O.P.I. Publication No. 2001-313178, Japanese Patent O.P.I. Publication No. 2001-313179, and Japanese Patent O.P.I. Publication No. 2002-184581) in which a phosphorescent element is manufactured employing as a host compound, an amine type carbazole derivative. However, at present, a more complex structure is necessary to manufacture a stable element sufficient to be practically used (see for example, Pioneer Gijutsu Johoshi, 11, 1, p. 13-20).

There is an example in which a phosphorescent compound emitting a blue to blue-green color light is used as a dopant compound and a carbazole derivative such as CBP is used as a host compound, but the external qauntum efficiency of this example is around 6%, which provides unsatisfactory results (see for example, Sixty second OyobutsuriGakkai Gakujutsukoenkai Yokoshu 12-a-M8), and there is room to be improved. With respect to a host compound in the light emission layer or a compound (for example, a hole transporting material, an electron transporting material or a hole blocking material) in a layer adjacent to the light emission layer in a phosphorescence organic EL element emitting a blue light, it is required not only to have the lowest excited triplet level identical to or higher than that of a phosphorescent compound but to have high mobility. However, at present, an effective means has not been found, and a blue light-emitting element with high efficiency has not been found.

SUMMARY OF THE INVENTION

An object of the invention is to provide an organic electroluminescent element with high luminance and long lifetime and a display employing the organic EL element.

DETAILED DESCRIPTION OF THE INVENTION

Figure 1:
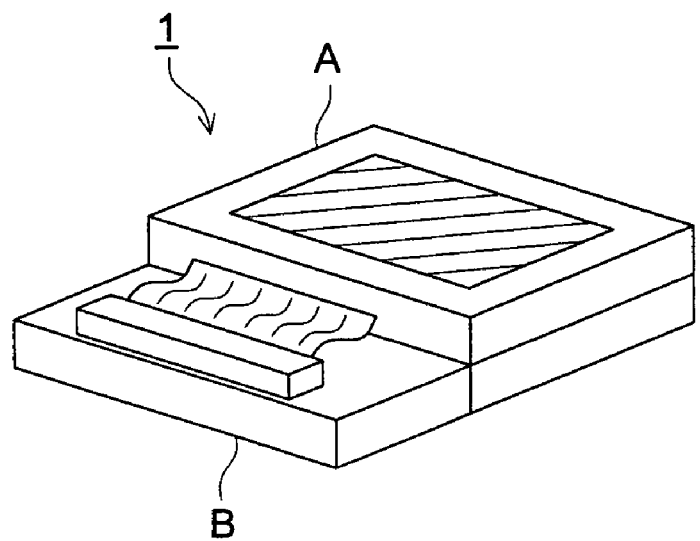
FIG. 1 is a schematic drawing of one example of a display comprising an organic EL element.

The above object of the invention can be attained by the following constitution:

1. An organic electroluminescent element comprising a light emission layer containing a host compound and a phosphorescent compound, the host compound having reorganization energy of from more than 0 to 0.50 eV, wherein the reorganization energy is energy in the process in which the host compound changes to the anion radical, and calculated employing Gaussian 98.

2. The organic electroluminescent element of item 1 above, wherein the host compound has a phosphorescence wavelength of from 300 to 460 nm.

3. The organic electroluminescent element of item 1 above, wherein the host compound has a phosphorescence wavelength of from 300 to 430 nm.

4. The organic electroluminescent element of item 3 above, wherein the phosphorescent compound has a phosphorescence wavelength of from 380 to 480 nm.

5. The organic electroluminescent element of item 4 above, wherein the phosphorescent compound is a metal complex containing a metal belonging to a group VIII of the periodic table as a center metal.

6. The organic electroluminescent element of item 5 above, wherein the phosphorescent compound is an osmium complex, an iridium complex or a platinum complex.

7. The organic electroluminescent element of item 6 above, wherein the phosphorescent compound is an iridium complex.

8. The organic electroluminescent element of item 1 above, wherein the host compound is a carbazole derivative.

9. A display comprising the organic electroluminescent element of item 1 above.

10. An organic electroluminescent element comprising a light emission layer containing a host compound having reorganization energy of from more than 0 to 0.50 eV and a phosphorescence wavelength of from 300 to 460 nm and a phosphorescent compound having a phosphorescence wavelength of from 380 to 480 nm, the phosphorescent compound being a metal complex containing a metal belonging to a group VIII of the periodic table as a center metal, wherein the reorganization energy is energy in the process in which the host compound changes to the anion radical and calculated employing Gaussian 98.

1-1. An organic electroluminescent element comprising a light emission layer containing a host compound and a phosphorescent compound, wherein reorganization energy in the process in which the host compound changes to the anion radical is from more than 0 to 0.50 eV, the reorganization energy being calculated employing Gaussian 98.

1-2. An organic electroluminescent element comprising a light emission layer containing a host compound and a phosphorescent compound, the host compound having a phosphorescence wavelength of from 300 to 460 nm, wherein reorganization energy in the process in which the host compound changes to the anion radical is from more than 0 to 0.50 eV, the reorganization energy being calculated employing Gaussian 98.

1-3. The organic electroluminescent element of item 1-2 above, wherein the host compound has a phosphorescence wavelength of from 300 to 430 nm.

1-4. An organic electroluminescent element comprising a light emission layer containing a host compound and a phosphorescent compound, the phosphorescent compound having a phosphorescence wavelength of from 380 to 480 nm, and the host compound having a phosphorescence wavelength of from 300 to 430 nm, wherein reorganization energy in the process in which the host compound changes to the anion radical is from more than 0 to 0.50 eV, the reorganization energy being calculated employing the Gaussian 98.

1-5. The organic electroluminescent element of any one of items 1-1 through 1-4 above, wherein the phosphorescent compound is an osmium complex, an iridium complex or a platinum complex.

1-6. The organic electroluminescent element of any one of items 1-1 through 1-4 above, wherein the phosphorescent compound is an iridium complex.

1-7. A display comprising the organic electroluminescent element of any one of items 1-1 through 1-6 above.

The present invention will be detailed below. The present inventors have an extensive study on an organic electroluminescent element, and have found an organic electroluminescent element providing high emission luminance, long emission lifetime and a display comprising the element. The organic electroluminescent element comprises a light emission layer containing a host compound and a phosphorescent compound, the host compound having reorganization energy of from more than 0 to 0.50 eV, wherein the reorganization energy is energy in the process in which the host compound changes to the anion radical, and calculated employing Gaussian 98. When the host compound has a phosphorescence wavelength of from 300 to 460 nm, the organic electroluminescent element exhibits better results. The phosphorescence wavelength of the host compound is most preferably from 300 to 430 nm. Further, the most preferred is when the phosphorescent compound has a phosphorescence wavelength of from 380 to 430 nm.

Calculation according to Density Functional Method (DFT Method) is preferred, and Key words such as B3LYP and B3PW91 are used. As basis function on calculation, 3-21G*, 6-31G, 6-31G*, cc-pVDZ, cc-PVTZ, LanL2DZ, or LanL2MB is used.

The reorganization energy herein referred to in the invention is energy in the process in which a neutral molecule changes to the anion radical in which the chemical structure is changed and is represented by parameter λ. The parameter λ is defined by the following formula (1).

$$\lambda = \lambda_1 + \lambda_2 \quad (1)$$

$$\lambda_1 = Ea - Eb \quad (2)$$

$$\lambda_2 = Ec - Ed \quad (3)$$

wherein Ea represents energy of an anion radical calculated based on the structure in the ground state of a neutral molecule, Eb energy of an anion radical having the optimized structure, Ec energy of a neutral molecule in the ground state calculated based on the structure of an anion radical, and Ed energy of a neutral molecule in the ground state having the optimized structure.

The reorganization energy is described in for example, literatures such as "K. Sakanoue et al., J. Phys. Chem., A1999, 103, 5551-5556" and "M. Malagoli et al., Chem. Phys. Letters, 327 (2000) 13-17".

Since carrier mobility of the phosphorescent compound in the light emission layer is poor, the host compound is considered to play a part as light emission layer. Accordingly, it is considered that a host compound with higher carrier mobility can provide light emission with higher luminance. Hitherto, various studies have been made on parameters controlling the carrier mobility. The present inventors have thought reorganization energy as one of the parameters. When an iridium complex is used as a phosphorescent compound in the light emission layer, a compound with high electron transportability as a host compound exhibits high performance. Thus, the manner in which the host compound becomes an anion radical is important. Further, it is considered that as the host compound with higher carrier mobility shortens dwell time of the carrier hoping moving on the molecule, chemical deterioration of the material used is restrained. The present inventors have studied on use of a compound whose reorganization energy is calculated to be small, and have found that a phosphorescent organic electroluminescent element, which employs such a compound as the host compound instead of a conventional host compound CBP, provides high emission luminance and long lifetime.

In the invention, luminance and lifetime of the phosphorescent organic electroluminescent element are increased by employing a host compound having a reorganization energy of from more than 0 to 0.50 eV. The reorganization energy is calculated employing a molecular orbital calculation software Gaussian 98 (Gaussian 98, Revision A. 11. 4, M. J. Frisch et al., Gaussian, Inc., Pittsburgh Pa., 2002).

The phosphorescence wavelength in the invention refers to a wavelength corresponding to a 0-0 band of the phosphorescence spectra measured at a temperature of 77 K of a compound dissolved in a mixture solvent of ethanol and methanol (=4:1 by volume).

In order to decrease the reorganization energy when an anion radical is formed, it is necessary that the molecular structure of the formed anion radical be fixed not to freely move. As a method of decreasing the reorganization energy, a method is considered in which freedom of a dihedral angle between two aromatic ring (such as benzene ring) planes in a molecule is restrained by incorporation of a substituent on the ring or in which a bulky alkylene chain is incorporated into a molecule.

In the invention, a carbazole derivative is preferably used as the host compound, but any compounds, other than the carbazole derivative, in which the reorganization energy is reduced by molecule design, can be used.

The carbazole derivative in the invention will be explained below.

The carbazole derivative is preferably a compound represented by formula 1, $$X_1-(A_1)_n \qquad \text{Formula 1}$$

wherein $X_1$ represents a chemical bond or a divalent linkage; n represents an integer of from 2 to 4; and $A_1$ represents a group represented by the following formula 2, provided that plural $A_1$s may be the same or different;

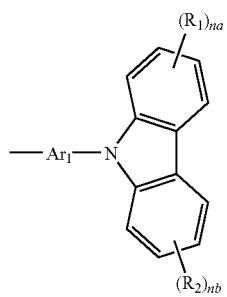

Formula 2 wherein $Ar_1$ represents a divalent substituted or unsubstituted aromatic hydrocarbon group or a divalent substituted or unsubstituted aromatic heterocyclic group, provided that when $X_1$ represents a chemical bond, $Ar_1$ has a substituent, and when $X_1$ represents a divalent linkage, at least one of $X_1$ and $Ar_1$ has a substituent; and $R_1$ and $R_2$ independently represent a hydrogen atom or a substituent; and na and nb independently represent an integer of from 1 to 4.

Examples of the substituent represented by $R_1$ and $R_2$ include an alkyl group (for example, a methyl group, an ethyl group, an isopropyl group, a hydroxyethyl group, a methoxymethyl group, a trifluoromethyl group or a t-butyl group), a cycloalkyl group (for example, a cyclopentyl group or a cyclohexyl group), an aryl group (for example, a phenyl group, a naphthyl group, a p-tolyl group, a p-chlorophenyl group or a mesityl group), a halogen atom, an alkenyl group (for example, a vinyl group), an alkoxycarbonyl group (for example, a methoxycarbonyl group or an ethoxycarbonyl group), an alkoxy group (for example, a methoxy group or an ethoxy group), an aryloxy group (for example, a phenoxy group), a dialkylamino group (for example, a diethylamino group or a diisopropylamino group), a cyano group, a hydroxyl group, a styryl group, and an aralkyl group (for example, a benzyl group or a 2-phenetyl group). The substituent is preferably an alkyl group, an alkoxy group or an aryl group, and more preferably a methyl group, a phenyl group or a methoxy group. These groups may further have a substituent. The substituent represented by $R_1$ through $R_4$ is preferably an alkyl group, an alkoxy group, or an aryl group.

Examples of the divalent substituted or unsubstituted aromatic hydrocarbon group or the divalent substituted or unsubstituted aromatic heterocyclic group include substituted or unsubstituted phenylene, substituted or unsubstituted biphenylene, substituted or unsubstituted naphthylene, substituted or unsubstituted anthrylene, substituted or unsubstituted phenanthrylene, substituted or unsubstituted pyrenylene, substituted or unsubstituted pyridylene, substituted or unsubstituted triazylene, substituted or unsubstituted pyrazylene, substituted or unsubstituted quinoxalylene, or substituted or unsubstituted thyenylene. Of these, the preferred is substituted or unsubstituted phenylene.

Examples of the substituent of the divalent substituted aromatic hydrocarbon or aromatic heterocyclic group are the same as those denoted in $R_1$ and $R_2$ above.

Exemplified compounds of the host compound in the invention will be listed below, but is not limited thereto.

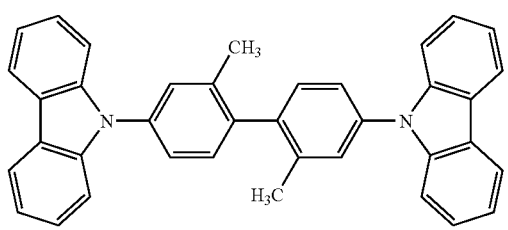

TCBP1

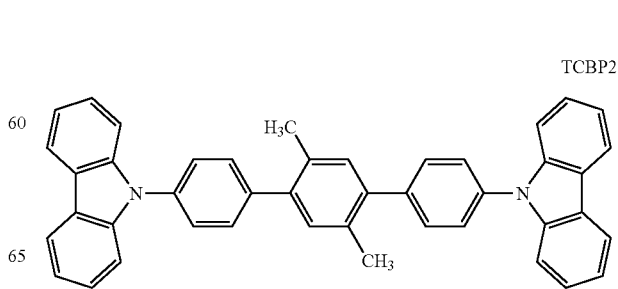

TCBP2

(1)
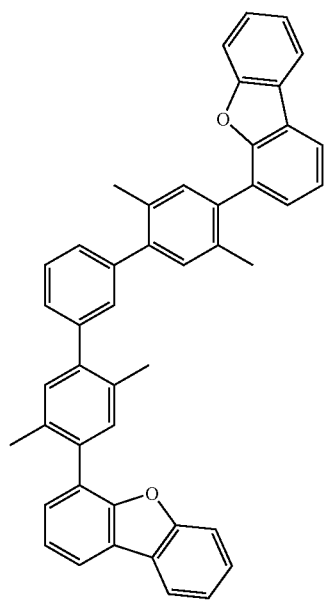
(2)
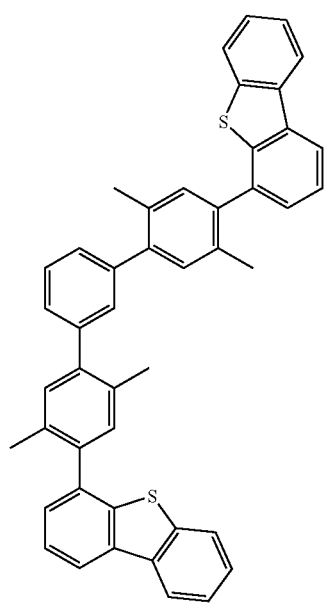
(3)
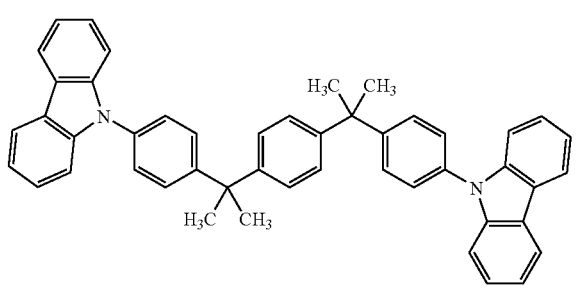
(4)
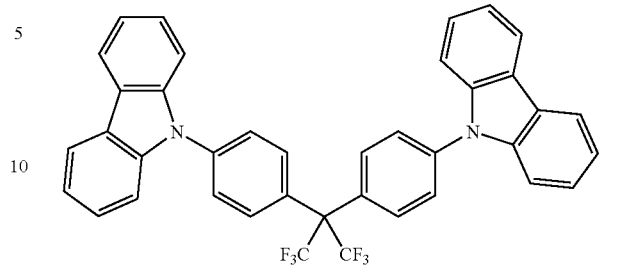
(5)
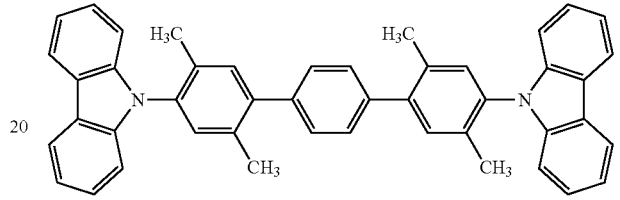
(6)
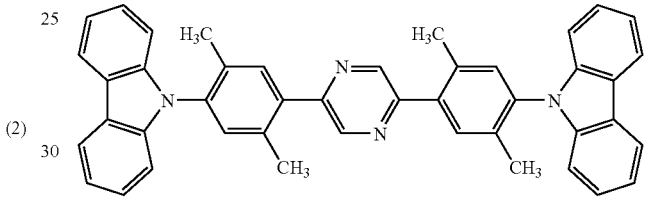
(7)
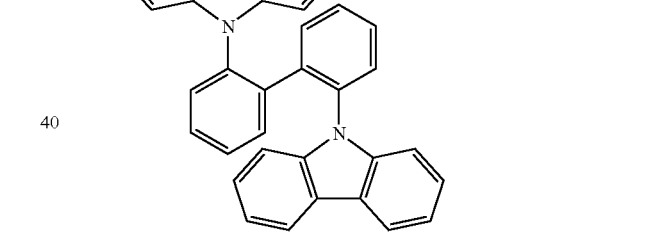
(8)
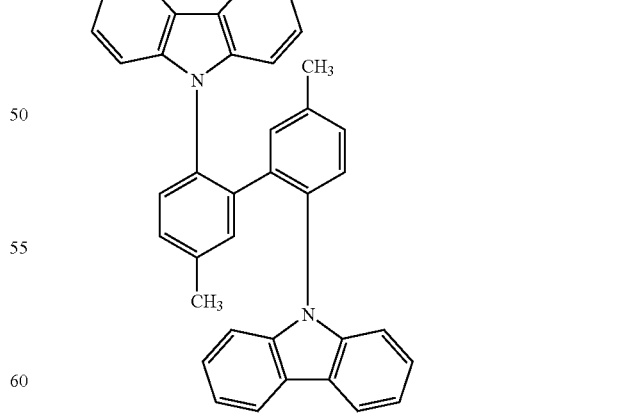
In the invention, a phosphorescent compound is used in the light emission layer, and known compounds used as a phosphorescent compound for the organic EL element can be used.

Further, as the dopant are listed an iridium complex disclosed in Japanese Patent O.P.I. Publication Nos. 2001-247859 or compounds represented by formula on pages 16-18 of WO/70655 such as tris(2-phenylpyridine)iridium, an osmium complex and a platinum complex such as 2,3,7,8,12,13,17,18-octaethyl-21H,23H-porphirin platinum complex. Employing such a phosphorescent compound as a dopant, an organic EL element with high internal quantum efficiency can be obtained.

The phosphorescent compound is preferably a metal complex containing a metal belonging to a group VIII of the periodic table as a center metal, and is more preferably an osmium complex, an iridium complex or a platinum complex, and still more preferably an iridium complex.

Exemplified compounds of the phosphorescent compound will be listed below.

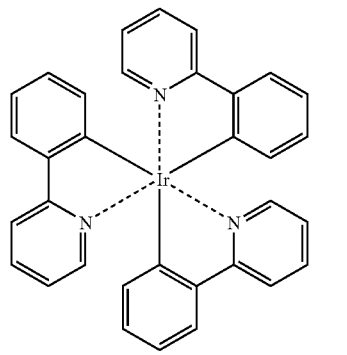
Ir-1

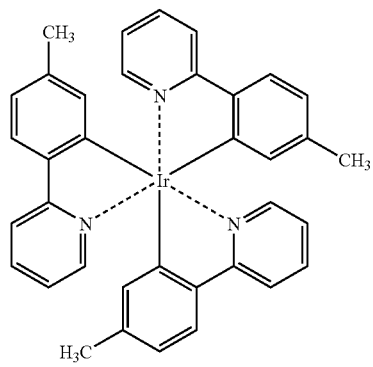
Ir-2

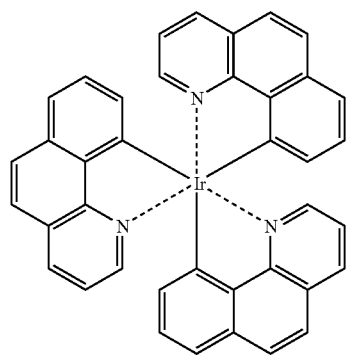
Ir-3

-continued

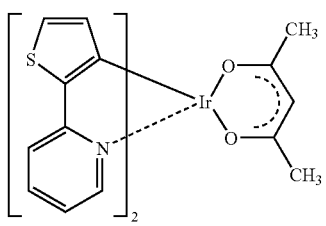
Ir-4

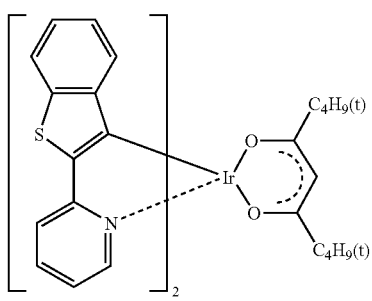
Ir-5

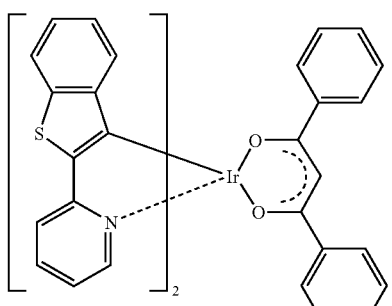
Ir-6

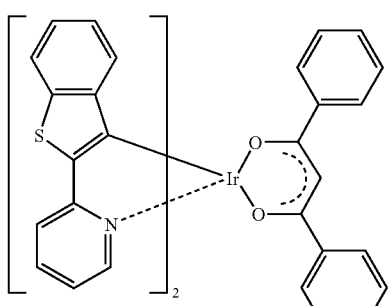
Ir-7

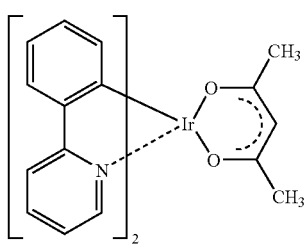
Ir-8

-continued

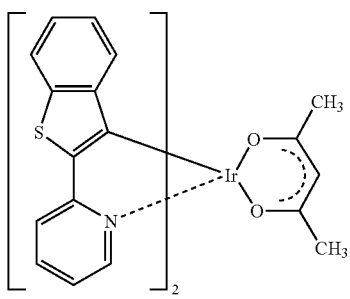
Ir-9

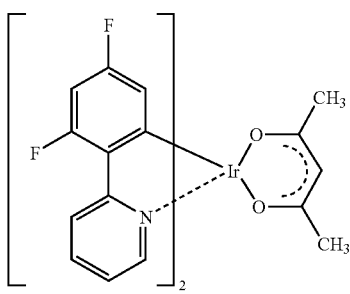
Ir-10

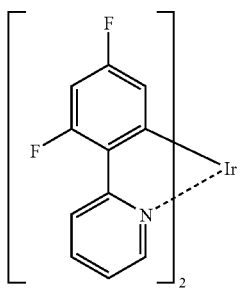
Ir-11

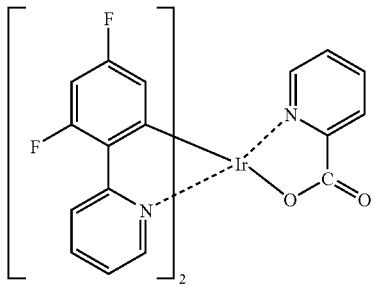
Ir-12

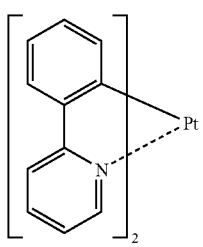
Pt-1

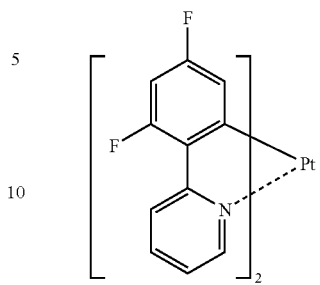
Pt-2

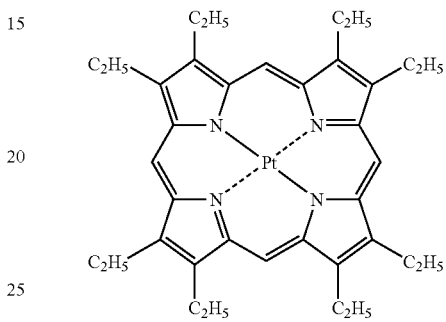
Pt-3

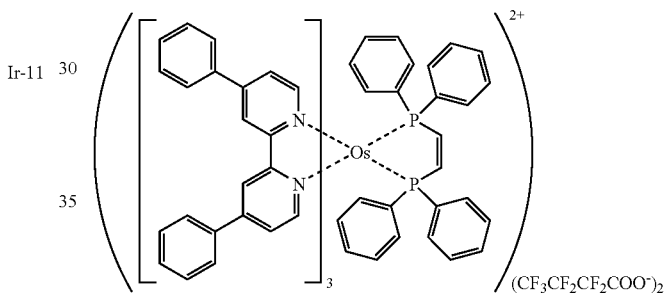
A-1

The light emission layer can be formed by layering the above compound by a known method such as a vacuum deposition method, a spin coat method, a casting method, an ink jet method, and an LB method.

The light emission layer may be a single layer containing one or more kinds of the above-described compounds or plural layers comprised of the same composition or different composition.

The phosphorescent compound in the invention has a phosphorescent quantum yield at 25° C. of not less than 0.001, preferably not less than 0.01, and more not less than 0.1. The phosphorescent quantum yield can be measured according to a method described in the fourth edition "Jikken Kagaku Koza 7", Bunko II, page 398 (1992) published by Maruzen.

Typical synthetic examples of the above compounds in the invention will be shown below. Other compounds can be also synthesized in the same manner as in the examples.

Synthetic Example 1

Synthesis of Compound TCBP1

Carbazole of 2.9 g and 3.0 g of 4,4'-dibromo-2,2'-dimethyl-biphenyl were incorporated in anhydrous xylene, and reacted at 120° C. for 4 hours while stirring in the presence of a mixture of palladium acetate and tri-tert-butylphosphine as a catalyst and of potassium carbonate as a base. After reaction was completed, the resulting reaction solution was mixed with ethyl acetate, tetrahydrofuran and water, and filtered employing diatomaceous earth. The organic solution phase of the filtrate was separated, and dried over magnesium sulfate. The solvent of the dried solution was distilled off under reduced pressure, and the residue was purified according to column chromatography. The purified product was recrystallized from toluene to obtain 3.7 g of Compound TCBP1 (Yield 82%). The recrystallized product was confirmed to be Compound TCBP1 according to NMR spectra or mass spectra.

Synthetic Example 2

Synthesis of Compound TCBP2

1-Bromo-4-jodobenzene of 50 g, 24 g of carbazole, 0.6 g of copper powder, and 19 g of potassium carbonate were added to 300 ml of dimethylformamide, and heated under reflux for 11 hours. The organic solution phase of the resulting reaction solution was separated, and purified according to column chromatography. The purified compound was recrystallized from acetonitrile to obtain 33 g of Compound A (white product, yield: 72%). Compound A of 8 g was dissolved in a 100 ml anhydrous tetrahydrofuran, and maintained at −70° C. with dry ice. Then, the resulting solution was added with 24 ml of a butyllithium n-hexane solution, stirred for one hour, further added with a solution in which 6.0 ml of trimethoxyborane was dissolved in 20 ml of anhydrous tetrahydrofuran, and stirred at room temperature for one day. After that, the resulting solution was added with 10% sulfuric acid solution, and stirred for one hour. The solvent of the solution was distilled off, and 20 ml of acetonitrile were added to the residue, and filtered to obtain 4.5 g of Compound B. Compound B of 3.0 g and 2,5-dibromo-p-xylene of 1.2 g were dissolved in 200 ml of anhydrous tetrahydrofuran, and reacted while heating with agitation for 20 hours in the presence of sodium carbonate and a palladium catalyst. After reaction was completed, the resulting reaction solution was mixed with water and ethyl acetate, and the organic solution phase of the mixture was separated, and dried over magnesium sulfate. The solvent of the dried solution was distilled off under reduced pressure, and the residue was purified according to column chromatography. The purified product was recrystallized from toluene to obtain 1.2 g of Compound TCBP2 (Yield 45%).

The recrystallized product was confirmed to be Exemplified compound 1-2 according to NMR spectra or mass spectra. A melting point of Exemplified compound 1-2 was 320 to 321° C.

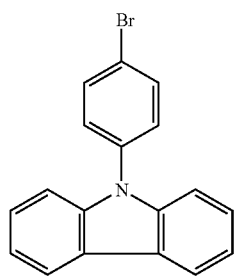

Compound A

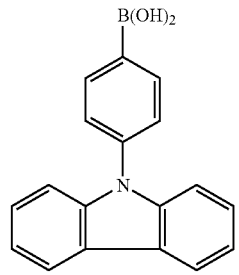

Compound B

The host compounds in the invention include those in which when used in combination with plural light-emitting dopant in an organic electroluminescent element, white light is emitted. However, at present, as a single compound emitting white light has not been found, white light is obtained mixing plural color lights, which are emitted from plural emission compounds. A combination of the plural color lights may be that of lights of three primary colors, blue, green, and red colors, each having a different emission maximum-providing wavelength, or that of lights of complementary colors such as blue and yellow colors, or blue green and orange colors, each having a different emission maximum-providing wavelength.

A combination for obtaining plural color lights may be a combination of materials emitting fluorescence or phosphorescence or a combination of light emitting-materials, which emit light absorbing fluorescence or phosphorescence, and colorants emitting light by absorbing excited light from the light emitting-materials.

When a hole transporting layer containing a hole transporting material is provided, the hole transporting material may be any as long as it can transport holes from an anode to a light emission layer. The hole transporting material can be selected from known ones used in a charge injecting material of a conventional photoconductive material or known ones used in the hole transporting material of a conventional EL element.

When an electron transporting layer containing an electron transporting material is provided, the electron transporting material may be any as long as it can transport electrons from a cathode to a light emission layer. The electron transporting material can be selected from known ones.

[Component Layer of Organic EL Element]

The component layer of the organic EL element of the invention will be shown below.

In the invention, preferred examples of the component layer of the organic EL element will be shown below, but the present invention is not limited thereto.

(i): Anode/Hole transporting layer/Light emission layer/Hole blocking layer/Electron transporting layer/Cathode (ii): Anode/Hole transporting layer/Light emission layer/Hole blocking layer/Electron transporting layer/Cathode buffering layer/Cathode (iii): Anode/Anode buffering layer/Hole transporting layer/Light emission layer/Hole blocking layer/Electron transporting layer/Cathode buffering layer/Cathode <<Anode>>

For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO, and a material capable of forming an amorphous and transparent conductive layer such as IDIXO ($In_2O_3$—ZnO). The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When light is emitted through the anode, the transmittance of the anode is preferably 10% or more, and the sheet resistance of the anode is preferably not more than several hundred Ω/□. The thickness of the layer is ordinarily within the range of from 10 nm to 1 μm, and preferably from 10 to 200 nm, although it may vary due to kinds of materials used.

<<Cathode>>

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred Ω/□, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

Next, an injecting layer, a hole transporting layer, and an electron transporting layer used in a layer constitution of the organic EL element of the invention will be explained.

<<Injecting Layer: Electron Injecting Layer, Hole Injecting Layer>>

The injecting layer is optionally provided, for example, an electron injecting layer or a hole injecting layer, and may be provided between the anode and the light emission layer or hole transporting layer, and between the cathode and the light emission layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" page 123, Div. 2 Chapter 2 of "Organic EL element and its frontier of industrialization" (published by NTS Corporation, Nov. 30, 1998) in detail.

The anode buffer layer (hole injecting layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injecting layer) is described in Japanese Patent O.P.I. Publication Nos. 6-325871, 9-17574, and 9-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide.

The buffer layer (injecting layer) is preferably very thin and has a thickness of preferably from 0.1 to 100 nm depending on kinds of the material used.

The hole transporting layer is comprised of material having an ability of transporting holes, and a hole injecting layer and an electron blocking layer are included in the hole transporting layer in a broad sense. The hole transporting layer or electron transporting layer may be a single layer or plural layers.

In the organic EL element of the invention, all of a host contained in the light emission layer, a hole transporting material contained in the hole transporting layer adjacent to the light emission layer, and an electron transporting material contained in the electron transporting layer adjacent to the light emission layer have a phosphorescence wavelength of preferably not longer than 460 nm, and more preferably from 300 to 460 nm.

<<Light Emission Layer>>

The light emission layer in the invention is a layer where electrons and holes, injected from electrodes, an electron transporting layer or a hole transporting layer, are recombined to emit light. The portions where light emits may be in the light emission layer or at the interface between the light emission layer and the layer adjacent thereto.

The light emission layer can be formed employing the above-described compounds and a known method such as a vacuum deposition method, a spin coat method, a casting method and an LB method. The thickness of the light emission layer is not specifically limited, but is ordinarily from 5 nm to 5 μm. The light emission layer may be composed of a single layer comprising one or two or more of light emission materials, or of plural layers comprising the same composition or different composition. The light emission layer in the invention is preferably a light emission layer containing two or more kinds of light emission materials, wherein at least one of the materials is the compound in the invention.

The light emission layer can be also formed by the method such as that described in Japanese Patent O.P.I. Publication No. 57-51781, in which the above-described light emission material is dissolved in a solvent together with a binder such as a resin, and the thus obtained solution is formed into a thin layer by a method such as a spin-coat method. Thickness of the emission layer thus formed is not specially restricted. Although the thickness of the layer thus formed is optionally selected, the thickness is ordinarily within the range of from 5 nm to 5 μm.

When the light emission layer contains two or more kinds of compounds, the main component is called a host compound and another compound a dopant compound. The content ratio of a dopant compound to a host compound as a main component is preferably from 0.1% by weight to less than 15% by weight.

(Host Compound)

In the light emission layer comprised of a mixture of two or more kinds of compounds, the compound having the highest content (by weight) in the mixture is a host compound (also referred to as simply a host) and the compound other than the host compound is a dopant compound (also referred to as simply a dopant). For example, when a compound A to a compound B ratio (by weight) in the light emission layer is 10:90, the compound A is a dopant compound, and the compound B is a host compound.

Further, when the content ratio, compound A:compound B:compound C in the light emission layer is 5:10:85, compounds A and B are dopant compounds, and compound C is a host compound.

(Dopant)

Next, the dopant compound will be explained.

The dopant is divided in two types in principle, one is an energy transfer type in which recombination of a carrier occurs on the host to which the carrier is transported to excite the host, the resulting energy is transferred to the dopant, and light is emitted from the dopant, and the other is a carrier trap type in which recombination of a carrier occurs on the dopant, a carrier trap material, and light is emitted from the dopant. However, in each type of the dopant, energy level of the dopant in excited state is lower than that of the host in excited state.

<<Hole Transporting Layer>>

The hole transporting layer is comprised of material having an ability of transporting holes, and a hole injecting layer and an electron blocking layer are included in the hole transporting layer in a broad sense. The hole transporting layer or electron transporting layer may be a single layer or plural layers.

The hole transporting materials are not specifically limited, and can be optionally selected from those employed for hole transporting materials in conventional photoconductive elements or known materials used in the hole injecting layer or hole transporting layer of conventional EL elements.

The hole transporting material described above may be either an organic substance or an inorganic substance as long as it has a hole injecting ability, a hole transporting ability or an ability to form a barrier to electrons. Examples of the hole injecting material or the hole transporting material include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis(4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used.

As the hole injecting material or the hole transporting material, inorganic compounds such as p-Si and p-SiC are usable.

In the invention, the hole transporting material contained in the hole transporting layer is preferably a compound having a molecular weight of from 600 to 1500.

The hole transporting layer can be formed by layering the hole transporting material by a known method such as a vacuum deposition method, a spin coat method, a casting method, an ink jet method, and an LB method. The thickness of the hole transporting layer is not specifically limited, but is ordinarily from 5 to 5000 nm. The hole transporting layer may be composed of a single layer structure comprising one or two or more of the materials mentioned above.

<<Electron Transporting Layer>>

The electron transporting layer comprises a material (an electron transporting material) having an electron transporting ability, and in a broad sense refers to an electron injecting layer or a hole blocking layer. The electron transporting layer can be provided as a single layer or plural layers.

The electron transporting layer may be any layer, as long as it has a function of incorporating electrons injected from a cathode to a light emission layer, and a material used in the electron transporting layer can be optionally selected from known compounds used as electron transporting materials.

Examples of the material used in the electron transporting layer (hereinafter also referred to as electron transporting material) include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

A polymer in which the material mentioned above is introduced in the polymer side chain or a polymer having the material as the polymer main chain can be also used.

A metal complex of an 8-quinolynol derivative such as aluminum tris-(8-quinolynol) ($Alq_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) ($Znq_2$), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emission layer may preferably be employed as the electron transporting material. An inorganic semiconductor such as n-Si and n-SiC may also be used as the electron transporting material in a similar way as in the hole transporting layer.

<<Substrate (Referred to as also Base Plate, Base or Support)>>

A substrate preferably employed for the organic electroluminescent element in the invention is not restricted to specific kinds of materials such as glass and plastic, as far as it is transparent. Examples of the substrate preferably used include glass, quartz and light transmissible plastic film. Especially preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP) and so on.

The surface of the resin film may have a layer of an inorganic or organic compound or a hybrid layer of both compounds.

The external light emission efficiency of the organic electroluminescent element of the invention is preferably not less than 1%, and more preferably not less than 2% at room temperature. Herein, external quantum yield (%) is represented by the following formula:

External quantum yield (%)=(the number of photons emitted to the exterior of the organic electroluminescent element×100)/(the number of electrons supplied to the organic electroluminescent element)

A hue improving filter such as a color filter may be used in combination.

[Display]

The multicolor display of the invention can be used as a display device, a display, or various light emission sources. The display device or the display, which employs three kinds of organic EL elements, an element emitting a blue light, an element emitting a red light and an element emitting a green light, can present a full color image.

Examples of the display device or the display include a television, a personal computer, a mobile device or an AV device, a display for text broadcasting, and an information display used in a car. The multicolor emission apparatus may be used as particularly a display for reproducing a still image or a moving image. When the apparatus is used as a display for reproducing a moving image, the driving method may be either a simple matrix (passive matrix) method or an active matrix method.

Examples of the light emission sources include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, but are not limited thereto.

The organic EL element of the invention may be an organic EL element having a resonator structure.

The organic EL element having a resonator structure is applied to a light source for a photo-memory medium, a light source for an electrophotographic copier, a light source for an optical communication instrument, or a light source for a photo-sensor, but its application is not limited thereto. In the above application, a laser oscillation may be carried out.

The organic EL element of the invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. The display can present a full color image, employing two or more kinds of organic EL elements each emitting light with a different color.

PRACTICAL EMBODIMENT OF THE INVENTION

One example of the display comprising the organic EL element of the invention will be explained below employing Figures.

FIG. 1 is a schematic drawing of one example of a display comprising an organic EL element. FIG. 1 is a display such as that of a cellular phone, displaying image information due to light emission from the organic EL.

A display 1 comprises a display section A having plural pixels and a control section B carrying out image scanning based on image information to display an image in the display section A. The control section B is electrically connected to the display section A, transmits a scanning signal and an image data signal to each of the plural pixels based on image information from the exterior, and conducts image scanning which emits light from each pixel due to the scanning signal according to the image data signal, whereby an image is displayed on the display section A.

Figure 2:
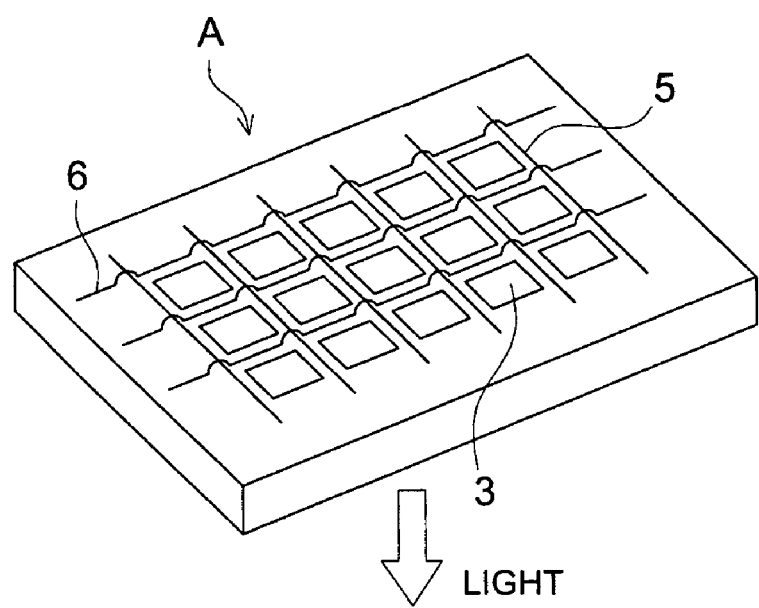
FIG. 2 is a schematic drawing of a display section A.

FIG. 2 is a schematic drawing of a display section A. The display section A comprises a glass substrate, plural pixels 3, and a wiring section comprising plural scanning lines 5 and plural data lines 6. The main members of the display section A will be explained below.

In FIG. 2, light from pixels 3 is emitted in the direction of an arrow. The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated). The plural pixels 3, when the scanning signal is applied from the scanning lines 5, receive the data signal from the data lines 6, and emit light corresponding to the image data received. Provision of red light emission pixels, green light emission pixels, and blue light emission pixels side by side on the same substrate can display a full color image.

Next, an emission process of pixels will be explained.

Figure 3:
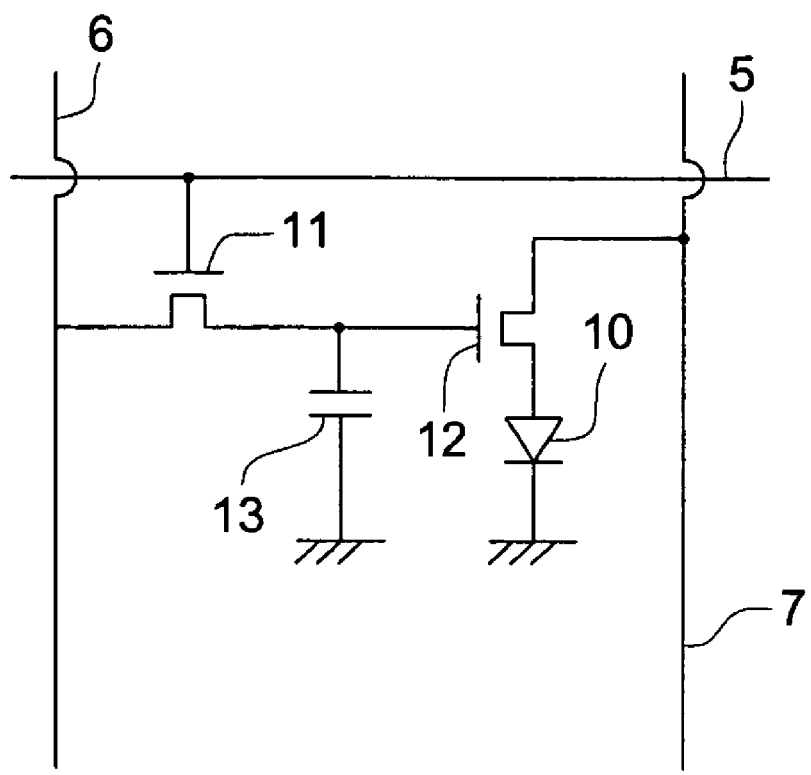
FIG. 3 is a schematic drawing of a pixel

FIG. 3 is a schematic drawing of a pixel.

The pixel comprises an organic EL element 10, a switching transistor 11, a driving transistor 12, and a capacitor 13. When a pixel with a red light emission organic EL element, a pixel with a green light emission organic EL element, and a pixel with a blue light emission organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, and emission due to on-off according to a binary value of the image data signals.

The electric potential of the capacitor 13 may maintain till the next application of the scanning signal, or may be discharged immediately before the next scanning signal is applied.

In the invention, light emission may be carried out employing a passive matrix method as well as the active matrix method as described above. The passive matrix method is one in which light is emitted from the organic EL element according to the data signal only when the scanning signals are scanned.

Figure 4:
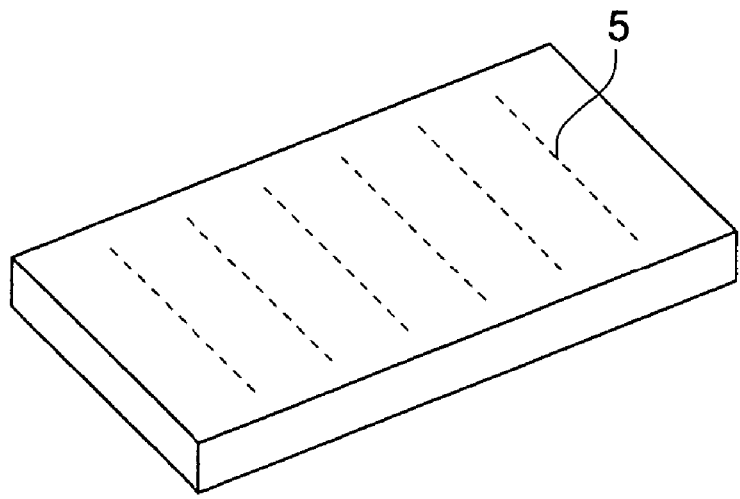
FIG. 4 is a schematic drawing of a display employing a passive matrix method.
Figure 4:
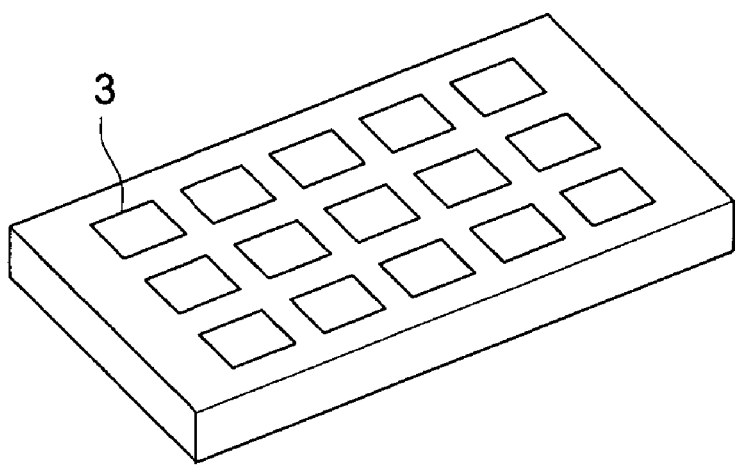
Figure 4:
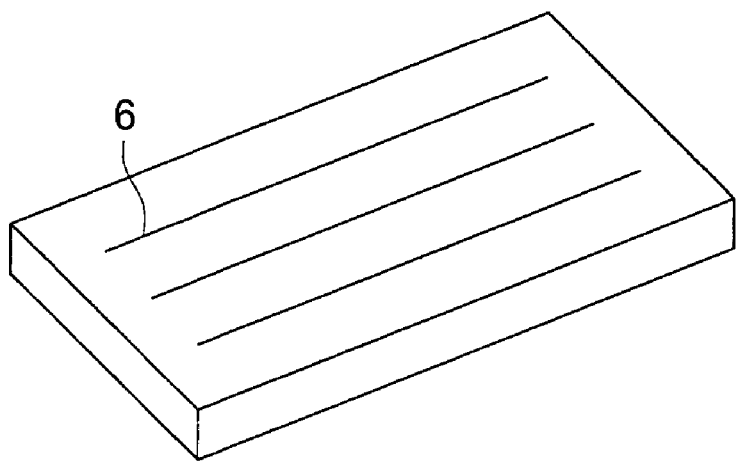

FIG. 4 is a schematic drawing of a display employing a passive matrix method.

In FIG. 4, pixels 3 are provided between the scanning lines 5 and the data lines 6, crossing with each other. When scanning signal is applied to scanning line 5 according to successive scanning, pixel 3 connecting the scanning line 5 emits according to the image data signal. The passive matrix method has no active element in the pixel 3, which reduces manufacturing cost of a display.

EXAMPLES

The present invention will be explained in the following examples, but is not limited thereto.

Example 1

<<Preparation of Organic EL Element Sample OLED 1-1; Comparative>>

A pattern was formed on a substrate (NA-45, manufactured by NH Technoglass Co., Ltd.) composed of a glass plate and a 150 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes.

The thus obtained transparent substrate was fixed on a substrate holder of a vacuum deposition apparatus available on the market. Further, α-NPD, CBP, Ir-12, BC and Alq$_3$ were put in each of five resistive heating molybdenum boats, and set in the vacuum deposition apparatus.

Thereafter, pressure in the vacuum tank was reduced to $4\times10^{-4}$ Pa, and α-NPD was deposited onto the transparent substrate to form a hole injecting/transporting layer with a thickness of 50 nm. After that, supplying electric current to the boat carrying CBP and the boat carrying Ir-12, individually, in which the depositing speed rate of CBP to Ir-12 was adjusted to be 100:7, CBP and Ir-12 were co-deposited onto the resulting hole transporting layer to form a light emission layer with a thickness of 30 nm. Subsequently, BC was deposited onto the resulting light emission layer to form a hole blocking layer with a thickness of 10 nm, and then, Alq$_3$ was deposited onto the resulting layer to form an electron transporting layer with a thickness of 40 nm.

Next, the vacuum tank was opened, and a stainless steel mask having a rectangular hole was placed on the electron injecting layer. Further, 3 g of magnesium were put in a resistive heating molybdenum boat and 0.5 g of silver were put in a tungsten basket for deposition. The resulting boat and basket were set in the vacuum tank. Pressure in the vacuum tank was reduced to $2\times10^{-4}$ Pa. Then, the boat carrying magnesium was heated by supplying an electric current so as to deposit magnesium at a deposition speed of from 1.5 to 2.0 nm/sec, and at this time, the basket carrying silver was simultaneously heated so as to deposit silver at a deposition speed of 0.1 nm/sec to form a cathode electrode (200 nm) composed of a mixture of magnesium and silver. Thus, a comparative organic EL element sample OLED 1-1 was prepared.

<<Preparation of Organic EL Element Samples OLED 1-2 through 1-5>>

Organic EL element samples OLED 1-2 through 1-5 were prepared in the same manner as comparative organic EL element sample OLED 1-1, except that CBP used in the light emission layer was replaced with compounds as shown in Table 1.

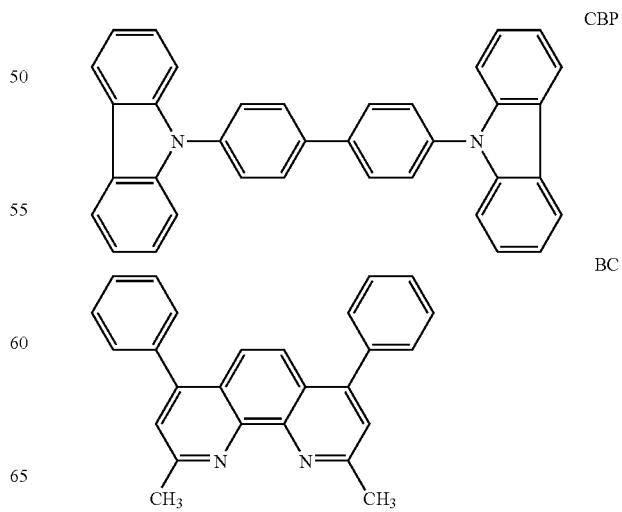

-continued

α-NPD

Alq₃

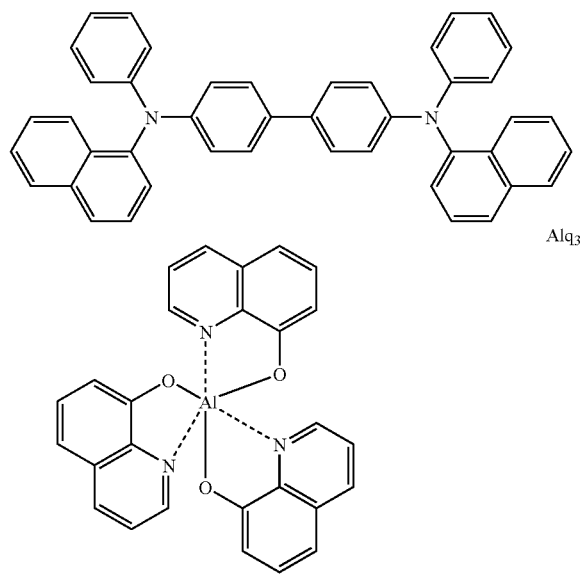

The resulting organic EL element samples OLED 1-1 through 1-5 were evaluated as follows:

<<Emission Luminance, Emission Lifetime>>

When a direct current of 2.5 mA/cm² was supplied to each sample at 23° C. in an atmosphere of a dry nitrogen gas, emission luminance (cd/m²) of light emitted and emission lifetime (time when the initial emission luminance reduces by half) were measured according to CS-1000 produced Minolta Co., Ltd.

Emission luminance and emission lifetime of each of the organic EL element samples OLED 1-2 through 1-5 were expressed by a relative value when the emission luminance and emission lifetime of organic EL element sample OLED 1-1 were set at 100, respectively. Calculation of the reorganization energy was carried out employing B3LYP/LanL2DZ. The results are shown in Table 1.

TABLE 1

| Sample OLED No. | Compound used in light emission layer | Re-organization energy (eV) | Emission luminance (%) | Emission lifetime (%) | Remarks |
|---|---|---|---|---|---|
| 1-1 | CBP | 0.56 | 100 | 100 | Comp. |
| 1-2 | TCBP1 | 0.41 | 165 | 135 | Inv. |
| 1-3 | TCBP2 | 0.29 | 148 | 155 | Inv. |
| 1-4 | BC | 0.54 | 105 | 85 | Comp. |
| 1-5 | *1 | 0.16 | 138 | 129 | Inv. |

*1: Exemplified compound (2)
Comp.: Comparative,
Inv.: Inventive

As is apparent from Table 1, inventive organic EL element samples OLED 1-2, 1-3, and 1-5 employing, as a host compound, the compound in the invention having a low orientation energy provide high emission luminance and long lifetime as compared with comparative organic EL element samples OLED 1-1 and 1-4 employing the comparative compound.

The phosphorescence wavelength of each of CBP, TCBP1, TCBP2, BC, and exemplified compound (2) is shown in Table 2.

The phosphorescence wavelength of Ir-12 is 458 nm.

TABLE 2

| Compound used in light emission layer | Phosphorescence wavelength (nm) |
|---|---|
| CBP | 465 |
| TCBP1 | 410 |
| TCBP2 | 412 |
| BC | 476 |
| Exemplified compound (2) | 435 |

Example 2

Organic EL element samples OLED 2-1 and 2-5 were prepared in the same manner as in OLED 1-1 and 1-5 in Example 1 above, respectively, except that Ir-1 was used instead of Ir-12. The resulting samples were evaluated for emission luminance and emission lifetime in the same manner as in Example 1. The emission luminance and emission lifetime of each of the organic EL element samples OLED 2-2 through 2-5 were expressed by a relative value when the emission luminance and emission lifetime of organic EL element sample OLED 2-1 were set at 100, respectively. The results are shown in Table 3.

TABLE 3

| Sample OLED No. | Compound used in light emission layer | Re-organization energy (eV) | Emission luminance (%) | Emission lifetime (%) | Remarks |
|---|---|---|---|---|---|
| 2-1 | CBP | 0.56 | 100 | 100 | Comp. |
| 2-2 | TCBP1 | 0.41 | 157 | 148 | Inv. |
| 2-3 | TCBP2 | 0.29 | 142 | 168 | Inv. |
| 2-4 | BC | 0.54 | 110 | 90 | Comp. |
| 2-5 | *1 | 0.16 | 135 | 138 | Inv. |

*1: Exemplified compound (2)
Comp.: Comparative,
Inv.: Inventive

As is apparent from Table 3, inventive organic EL element samples OLED 2-2, 2-3, and 2-5 employing, as a host compound, the compound in the invention having a low orientation energy provide high emission luminance and long lifetime as compared with comparative organic EL element samples OLED 2-1 and 2-4 employing the comparative compound. Calculation of the reorganization energy was carried out employing B3LYP/LanL2DZ.

The phosphorescence wavelength of Ir-1 is 495 nm.

Example 3

<<Preparation of Full Color Image Display>>

(Preparation of Blue Light Emission Element)

A blue light emission organic EL element was prepared in the same manner as in organic EL element sample OLED 1-1 of Example 1, except that m-MTDATXA was used in the hole injecting/transporting layer, TCBP2 and Ir-12 were used in the light emission layer, in which the depositing speed rate of TCBP2 to Ir-12 was adjusted to be 100:7, and BC was used in the hole blocking layer, and further, on an Alq₃ electron transporting layer, lithium fluoride was deposited to form a cathode buffering layer with a thickness of 0.5 nm and then, aluminum was deposited to form a cathode with a thickness of 110 nm.

(Preparation of Green Light Emission Element)

A green light emission element was prepared in the same manner as in the blue light emission element above, except that Ir-1 was used in the light emission layer (in which the depositing speed rate of TCBP2 to Ir-1 was adjusted to be 100:7), instead of Ir-12.

(Preparation of Red Light Emission Element)

A red light emission organic EL element was prepared in the same manner as in the blue light emission organic EL element above, except that Ir-9 was used in the light emission layer (in which the depositing speed rate of TCBP2 to Ir-9 was adjusted to be 100:7), instead of Ir-12.

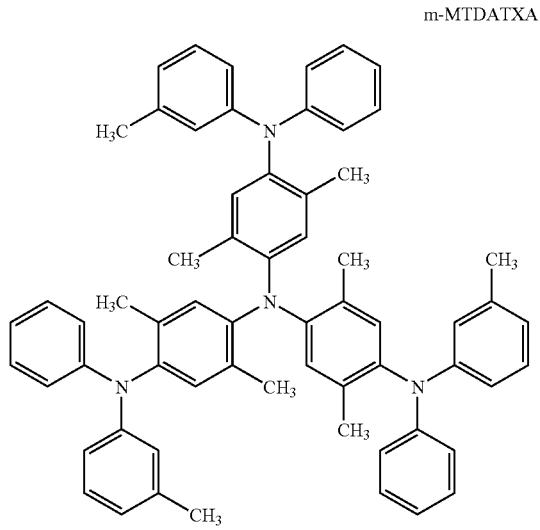

The red, green and blue light emission organic EL elements were provided side by side on the same substrate. Thus, a full color image display according to an active matrix system was obtained which had a structure as shown in FIG. 1. FIG. 2 is a schematic drawing of a display section A of the full color image display prepared above. The display section A comprises plural pixels 3 (including blue light emission pixels, green light emission pixels, and red light emission pixels) and a wiring section including plural scanning lines 5 and plural data lines 6, which were provided on the same substrate. The plural scanning lines 5 and plural data lines 6 each are composed of electroconductive material. The plural scanning lines 5 and plural data lines 6 were crossed with each other at a right angle, and connected with the pixels 3 at the crossed points (not illustrated in detail). Each of the plural pixels 3, which comprise an organic EL element corresponding to the respective color, a switching transistor as an active element, and a driving transistor, is driven according to an active matrix system. The plural pixels 3, when scanning signal is applied from the scanning lines 5, receives the image data signal from the data lines 6, and emits light corresponding to the image data received. Thus, a full color image can be displayed by a red light emission pixel, a green light emission pixel, and a blue light emission pixel, each suitably arranged side by side on the same substrate.

A full color clear moving image with high luminance and high durability was obtained by driving the full color image display prepared above.

EFFECT OF THE INVENTION

The present invention can provide an organic EL element with high luminance and long emission lifetime and a display employing the organic EL element.

What is claimed is:

1. An organic electroluminescent element comprising a light emission layer containing a host compound and a phosphorescent compound, the host compound having reorganization energy of from more than 0 to 0.50 eV, wherein the reorganization energy is energy in the process in which the host compound changes to the anion radical, and calculated employing Gaussian 98, wherein the host compound is represented by Formula 1 below, $$X_1-(A_1)_n,$$  Formula 1 wherein $X_1$ represents a chemical bond; n represents an integer of 2; and $A_1$ represents a group represented by the following Formula 2 below, provided that plural $A_1$s may be the same or different;

Formula 2:

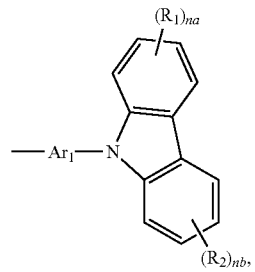

wherein $Ar_1$ represents a substituted phenylene group having a substituent in an ortho position relative to the chemical bond; and $R_1$ and $R_2$ independently represent a hydrogen atom or a substituent; and na and nb independently represent an integer of from 1 to 4.

2. The organic electroluminescent element of claim 1, wherein the host compound has a phosphorescence wavelength of from 300 to 460 nm.

3. The organic electroluminescent element of claim 1, wherein the host compound has a phosphorescence wavelength of from 300 to 430 nm.

4. The organic electroluminescent element of claim 3, wherein the phosphorescent compound has a phosphorescence wavelength of from 380 to 480 nm.

5. The organic electroluminescent element of claim 4, wherein the phosphorescent compound is a metal complex containing a metal belonging to a group VIII of the periodic table as a center metal.

6. The organic electroluminescent element of claim 5, wherein the phosphorescent compound is an osmium complex, an iridium complex or a platinum complex.

7. The organic electroluminescent element of claim 6, wherein the phosphorescent compound is an iridium complex.

8. A display comprising the organic electroluminescent element of claim 1.

9. The organic electroluminescent element of claim 1, wherein the substituents of R1 and R2 and the substituents in the ortho position relative to the chemical bond independently represent an alkyl group, a cycloalkyl group, an aryl group, a halogen atom, an alkenyl group, and alkoxycarbonyl group, an alkoxy group, an aryloxy group, a dialkylamino group, a cyano group, a hydroxyl group, a styryl group, or an aralkyl group.

10. An organic electroluminescent element comprising a light emission layer containing a host compound having reorganization energy of from more than 0 to 0.50 eV and a phosphorescence wavelength of from 300 to 460 nm and a phosphorescent compound having a phosphorescence wavelength of from 380 to 480 nm, the phosphorescent compound being a metal complex containing a metal belonging to a group VIII of the periodic table as a center metal, wherein the reorganization energy is energy in the process in which the host compound changes to the anion radical and calculated employing Gaussian 98, wherein the host compound is represented by Formula 1 below, $$X_1-(A_1)_n,$$ Formula 1 wherein $X_1$ represents a chemical bond; n represents an integer of 2; and $A_1$ represents a group represented by the following Formula 2 below, provided that plural $A_1$s may be the same or different;

Formula 2:

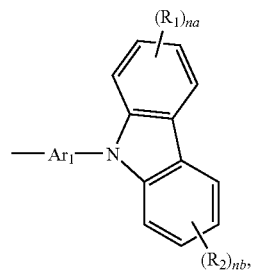

wherein $Ar_1$ represents a substituted phenylene group having a substituent in an ortho position relative to the chemical bond; and $R_1$ and $R_2$ independently represent a hydrogen atom or a substituent; and na and nb independently represent an integer of from 1 to 4.

11. The organic electroluminescent element of claim 10, wherein the substituents of R1 and R2 and the substituents in the ortho position relative to the chemical bond independently represent an alkyl group, a cycloalkyl group, an aryl group, a halogen atom, an alkenyl group, and alkoxycarbonyl group, an alkoxy group, an aryloxy group, a dialkylamino group, a cyano group, a hydroxyl group, a styryl group, or an aralkyl group.

* * * * *